(12) United States Patent
Hytros et al.

(10) Patent No.: US 6,827,815 B2
(45) Date of Patent: Dec. 7, 2004

(54) SHOWERHEAD ASSEMBLY FOR A PROCESSING CHAMBER

(75) Inventors: Mark M. Hytros, Santa Clara, CA (US); Truc T. Tran, Fremont, CA (US); Hongbee Teoh, Saratoga, CA (US); Lawrence Chung-Lai Lei, Milipitas, CA (US); Avgerinos Gelatos, Redwood City, CA (US); Salvador P. Umotoy, Antioch, CA (US)

(73) Assignee: Applied Materials, Inc., Santa Clara, CA (US)

( * ) Notice: Subject to any disclaimer, the term of this patent is extended or adjusted under 35 U.S.C. 154(b) by 352 days.

(21) Appl. No.: 10/047,076

(22) Filed: Jan. 15, 2002

(65) Prior Publication Data

US 2003/0132319 A1 Jul. 17, 2003

(51) Int. Cl.[7] .................... C23C 16/00; H01L 21/306
(52) U.S. Cl. ....................... 156/345.33; 156/345.32; 118/715
(58) Field of Search .................. 118/715; 156/345.33, 156/345.34

(56) References Cited

U.S. PATENT DOCUMENTS

| | | | |
|---|---|---|---|
| 4,877,757 A | 10/1989 | York et al. ................ 437/235 |
| 4,891,488 A | 1/1990 | Davis et al. ............. 219/121.4 |
| 4,904,621 A | 2/1990 | Loewenstein et al. ...... 437/225 |
| 4,988,533 A | 1/1991 | Freeman et al. ............. 427/38 |
| 5,091,217 A | 2/1992 | Hey et al. ............... 427/248.1 |
| 5,273,588 A | 12/1993 | Foster et al. ............... 118/723 |
| 5,569,356 A | 10/1996 | Lenz et al. ............... 156/643.1 |
| 5,680,013 A | * 10/1997 | Dornfest et al. ......... 315/111.21 |
| 5,882,411 A | 3/1999 | Zhao et al. ................ 118/715 |
| 5,903,009 A | 5/1999 | Bernstein et al. ...... 250/492.21 |
| 6,036,782 A | 3/2000 | Tanaka et al. ............. 118/715 |
| 6,037,001 A | 3/2000 | Kaloyeros et al. .......... 427/250 |
| 6,050,216 A | 4/2000 | Szapucki et al. ........ 118/723 E |
| 6,051,286 A | 4/2000 | Zhao et al. ................ 427/576 |
| 6,066,196 A | 5/2000 | Kaloyeros et al. ......... 106/1.18 |
| 6,073,577 A | 6/2000 | Lilleland et al. ........ 118/723 E |
| 6,079,356 A | 6/2000 | Umotoy et al. .......... 118/723 E |
| 6,148,765 A | 11/2000 | Lilleland et al. ........ 118/723 E |
| 6,170,432 B1 | 1/2001 | Szapucki et al. ........ 118/723 E |
| 6,176,978 B1 | 1/2001 | Ngan .................... 204/192.12 |
| 6,194,322 B1 | 2/2001 | Lilleland et al. ............ 438/710 |
| 6,237,528 B1 | 5/2001 | Szapucki et al. ........ 118/723 E |
| 6,289,842 B1 | 9/2001 | Tompa .................... 118/723 E |
| 6,302,964 B1 | 10/2001 | Umotoy et al. ............. 118/715 |
| 6,477,980 B1 | * 11/2002 | White et al. ............. 118/723 E |
| 2001/0031557 A1 | 10/2001 | Lilleland et al. ............ 438/689 |
| 2003/0132319 A1 | * 7/2003 | Hytros et al. ............... 239/548 |

FOREIGN PATENT DOCUMENTS

| | | | | |
|---|---|---|---|---|
| EP | 0 843 348 A2 | 5/1998 | ......... H01L/21/316 |
| JP | 2001-135499 | 5/2001 | ............ H05H/1/46 |

OTHER PUBLICATIONS

International Search Report, dated May 16, 2003 for PCT/US03/01130.

* cited by examiner

Primary Examiner—Jeffrie R. Lund
(74) Attorney, Agent, or Firm—Moser Patterson Sheridan (57) ABSTRACT

A showerhead assembly for distributing gases within a processing chamber is provided. In one embodiment, the showerhead assembly includes a cylindrical member having a faceplate coupled thereto. The cylindrical member has an outwardly extending first flange at a first end. The faceplate is coupled to a second end of the cylindrical member and has a plurality of holes formed though a center region of the faceplate. The joint between the cylindrical member and the faceplate allow for relative movement when subjected to thermal stresses. In another embodiment, at least one clamp member retains the faceplate to the second end of the cylindrical member.

20 Claims, 7 Drawing Sheets

SHOWERHEAD ASSEMBLY FOR A PROCESSING CHAMBER

BACKGROUND OF THE INVENTION

1. Field of the Invention

Embodiments of the invention generally relate to an apparatus for the distribution of gases within a process chamber.

2. Background of the Related Art

Integrated circuits have evolved into complex devices that can include millions of transistors, resistors and capacitors on a single chip. The evolution of chip design continually requires faster circuitry and greater circuit density that demand increasingly precise fabrication processes. One fabrication process frequently used is chemical vapor deposition (CVD). Chemical vapor deposition is generally employed to deposit a thin film on a substrate such as a semiconductor wafer. Chemical vapor deposition is generally accomplished by introducing a precursor gas into a vacuum chamber. The precursor gas is typically directed through a showerhead assembly situated near the top of the chamber. The precursor gas reacts to form a layer of material on the surface of the substrate as positioned on a heated support below the showerhead assembly. Volatile by-products produced during the reaction are pumped from the chamber through an exhaust system. One material frequently deposited on a substrate using chemical vapor deposition techniques is titanium.

One example of a titanium deposition is a chemical vapor deposition process that includes thermally decomposing titanium tetrachloride and hydrogen to deposit titanium on the substrate. The precursor gases generally flow through a showerhead to enhance deposition uniformity across the substrate. As this titanium deposition process is thermally driven, maintaining the showerhead at an elevated temperature enhances the titanium deposition rate. However, the elevated temperatures along with the chlorine rich environment of the reaction process and gases used to clean the showerhead often corrode the showerhead that is typically fabricated from aluminum. Coatings, such as nickel plating, are typically used to protect aluminum showerheads but often flake off, particularly near threaded holes where the plating may be damaged by fasteners allowing the underlying aluminum to be attacked. Particulates from the corroded showerhead assembly and flakes from the protective coatings may contaminate substrates during processing, resulting in costly chamber downtime and substrate defects.

State of the art showerheads are generally fabricated from a single element or mass of material. These showerheads include a mounting portion circumscribing a perforated faceplate. Since the faceplate portion of the showerhead is subjected to greater heat than the mounting portion during processing, thermal gradients exist in the showerhead that highly stress the faceplate and often result in cracking or warping of the faceplate.

Moreover, the lid that supports the showerhead is typically cooled to prevent premature reaction and deposition of titanium within the lid. The cooled lid further accentuates the temperature difference/gradient between the mounting portion and the faceplate of the showerhead, and heightens the probability of the faceplate of the showerhead to crack or warp as it is thermally cycled over its life, particularly when used at process temperatures in excess of 350 degrees Celsius. A cracked or warped showerhead disrupts the flow uniformity of gases passing through the showerhead, resulting in poor deposition uniformity thereby necessitating replacement of the showerhead.

Therefore, there is a need for an apparatus for the distribution of gas in the chemical vapor deposition chamber.

SUMMARY OF THE INVENTION

In one aspect of the invention, a showerhead assembly for distributing gases within a processing chamber is provided. In one embodiment, a showerhead assembly for distributing gases within a processing chamber includes a cylindrical member having a faceplate coupled thereto. The cylindrical member has an outwardly extending first flange at a first end. The faceplate is coupled to a second end of the cylindrical member and has a plurality of holes formed though a center region of the faceplate.

In another embodiment, a showerhead assembly for distributing gases within a processing chamber includes a faceplate disposed between a cylindrical member and at least one clamp member. The clamp member is urged against the cylindrical member, thereby clamping the faceplate therebetween.

In another embodiment, a showerhead assembly for distributing gases within a processing chamber includes a cylindrical member, a disk and a means for clamping the disk to the cylindrical member that allows movement of the disk relative to the cylindrical member.

In another aspect of the invention, a processing chamber is provided. In one embodiment, a processing chamber includes a chamber body having walls and a bottom defining a processing region, a substrate support disposed in the processing region and a gas box supported by the walls and having a fluid channel disposed therethrough, a cylindrical member supported by the walls and a faceplate coupled to the cylindrical member. The cylindrical member is comprised of nickel and has an outwardly extending first flange at a first end that is disposed between the gas box and the walls of the chamber body. A second end of the cylindrical member extends into the processing region. The faceplate is comprised of nickel or graphite and is coupled to the cylindrical member at the second end. The faceplate has a plurality of holes formed though a center region of the faceplate.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

The present invention generally provides a processing system having a multi-part showerhead assembly that is advantageous for the deposition of titanium, titanium nitride, tungsten and other films. The invention is illustratively described below in reference to a chemical vapor deposition system, such as a WxZ™ Metal Chemical Vapor Deposition System (MCVD) available from Applied Materials, Inc. located in Santa Clara, Calif. However, it should be understood that the invention has utility in other semiconductor processing systems, including etch and deposition systems or other systems in which dispensing a gas through a showerhead assembly into a processing chamber is desired.

Figure 1:
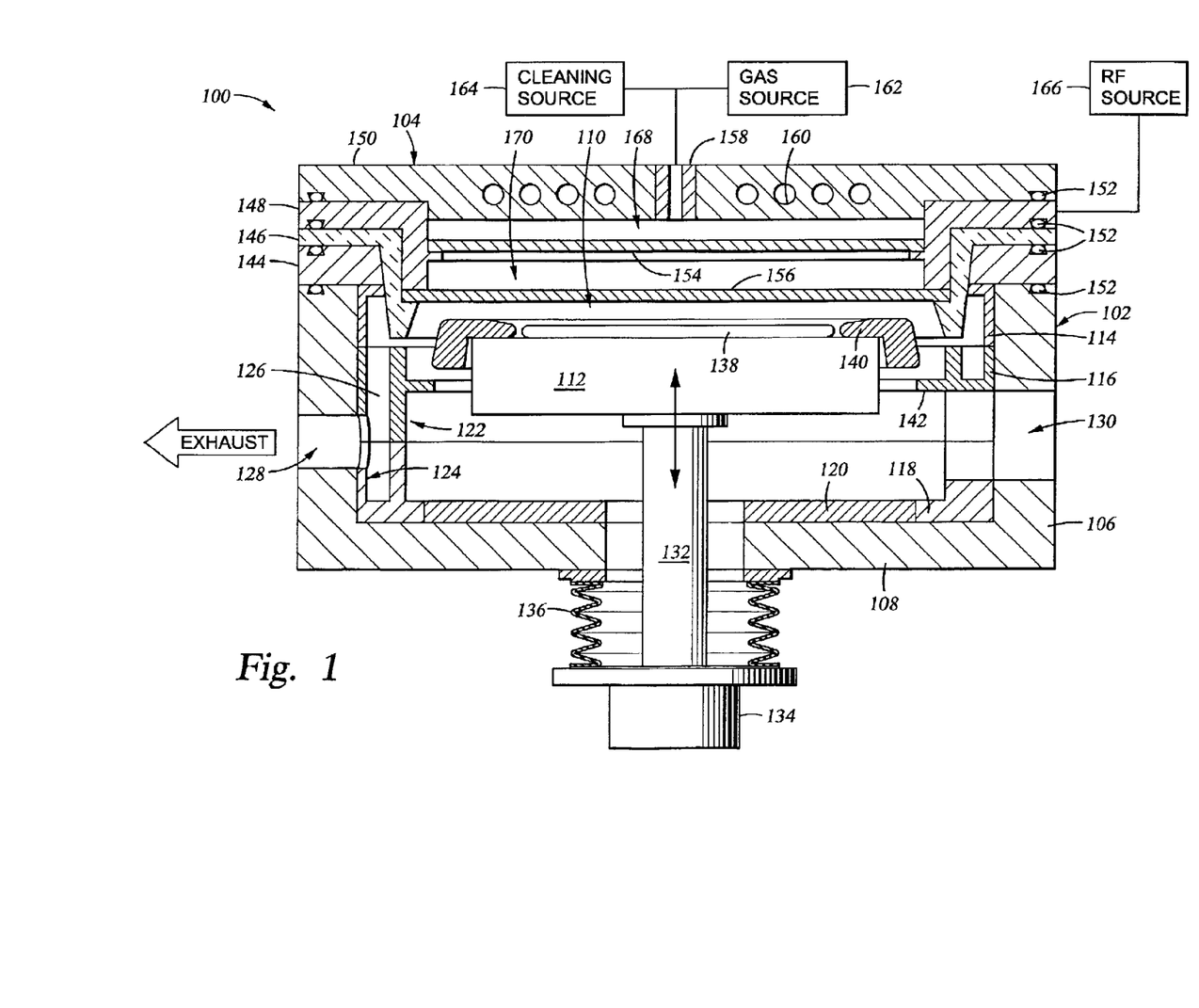
FIG. 1 is a simplified sectional view of a process chamber having a lid assembly.

FIG. 1 is a simplified sectional view of an illustrative a chemical vapor deposition system 100 incorporating a showerhead assembly 148 of the invention. The system 100 generally includes a chamber body 102 and a lid assembly 104 which define a process volume 110. A gas source 162 is coupled to the lid assembly 104 to provide process gases to the process volume 110. The chamber body 102 is typically fabricated from welded stainless steel plates or a unitary block of aluminum. The chamber body 102 generally includes a bottom 108 and walls 106 that support the lid assembly 104.

Typically, at least some portions or the chamber body 102 and the lid assembly 104 are lined by a plurality of chamber liners that generally are part of a process kit that can be removed for cleaning and/or replacement. In the embodiment depicted in FIG. 1, the system 100 includes a lid liner 114, an upper liner 116, a lower liner 118 and a bottom liner 120. The liners 114, 116, 118 and 120 are typically comprised of quartz. The bottom liner 120 is typically disposed on the bottom 108 of the chamber body 102. The lower liner 118 is typically annular in form and is disposed proximate the sidewalls 106 of the chamber body 102. The upper liner 116 is also annular in form and is supported by the lower liner 118 proximate the sidewalls 106. The lid liner 114 is supported by the upper liner 116 and is disposed adjacent to the lid assembly 104 and the upper portion of the sidewalls 106. The upper and lower liners 116, 118 generally include an inner annular portion 122 and an outer annular portion 124 that define a pumping passage 126 that substantially circumscribes the process volume 110. The pumping passage 126 is typically coupled to a pumping system (not shown) through an exhaust port 128 formed through the chamber body 102 and the upper and lower liners 116, 118. An access port 130 is additionally formed through the chamber body 102 and upper and lower liners 116, 118 to allow entry and egress of a substrate 138 to the process volume 110.

A heated substrate support 112 is generally disposed within the chamber body 102. The substrate support 112 generally supports the substrate 138 during processing. The substrate support 112 is typically fabricated from aluminum or ceramic and typically includes a heating element such as a resistive heater (not shown). An example of a substrate support 112 that may be adapted to benefit from the invention is described in U.S. Pat. Ser. No. 09/596,854, filed Jun. 19, 2000, which is hereby incorporated by reference herein in its entirety.

The substrate support 112 is coupled to a lift mechanism 134 by a shaft 132 that passes through the chamber bottom 108. The lift mechanism 134 is flexibly sealed to the chamber bottom by a bellows 136 that prevents vacuum leakage from around the shaft 132. The lift mechanism 134 allows the substrate support 112 to be moved vertically within the process volume 110 between a process position (as shown in FIG. 1) and a lower transfer position that facilitates transfer of the substrate 138 from the substrate support 112 through the access port 130.

A purge ring 140 is typically seated on the substrate support 112 and circumscribes the substrate 138. The purge ring 140 channels purge gas around the perimeter of the substrate 138, thereby preventing adherence of the substrate 138 to the substrate support 112 during deposition processing. Additionally, the purge ring 140 helps confine the plasma over the substrate during processing. The purge ring 140 is typically supported by the substrate support 112 when in the elevated process position. As the substrate support 112 is lowered to the transfer position, the purge ring 140 is supported by lip 142 extending inwardly from the upper liner, thereby allowing access to the substrate 138 by a transfer mechanism (not shown) through the access port 130.

The lid assembly 104 generally includes a lid plate 144, a gas box 150, an isolator 146 and the showerhead assembly 148. The lid plate 144 is generally seated on the walls 106 of the chamber body 102 and is typically coupled thereto by a hinge (not shown) to allow the lid assembly 104 to be opened, exposing the interior of the chamber body 102. The showerhead assembly 148 is typically sandwiched between the gas box 150 and the lid plate 144. The showerhead assembly 148 is typically comprised of a conductive material and is coupled to the RF source 166. The showerhead assembly 148 generally suspends a perforated blocker plate 154 and a perforated faceplate 156 between the gas box 150 and the substrate support 112 to facilitate uniform gas delivery to the chamber volume 110. The faceplate 156 is coupled to the showerhead assembly 148 in a manner that allows relative movement between the faceplate 156 and the showerhead assembly 148 that relieves stresses induced by thermal expansion and contraction of the faceplate 156 thereby preventing the faceplate 156 from cracking and/or warping due to thermal changes.

The showerhead assembly 148 is generally electrically isolated from the lid plate 144 by the isolator 146. Generally, seals 152 are disposed between the walls 106, the lid plate 144, the isolator 146, the showerhead assembly 148 and the gas box 150 to prevent gas leakage therebetween.

The gas box 150 is generally supported by the showerhead assembly 148. The gas box typically includes a mixing block 158 and a plurality of channels 160 formed therein. The channels 160 are typically coupled to a heat transfer fluid source (not shown) that flows a heat transfer fluid through the channels 160 to control the temperature of the gas box 150. The mixing block 158 is typically coupled to the gas source 162 and generally mixes the precursor gases provided from the gas source 162 prior to flowing into the process volume 110. A cleaning source 164 is fluidly coupled to the mixing block 158 to provide cleaning agents, such as chlorine or fluorine, which etch away deposited materials from the mixing block 158 and other chamber components. Examples of mixing blocks which may be adapted to benefit from the invention are described in U.S. patent application Ser. No. 09/602,657, filed Jun. 22, 2000 by Vo et al., and U.S. patent application Ser. No. 09/609,994, filed Jul. 5, 2000 by Shmurun, et al., both of which are hereby incorporated by reference in their entirety.

Gases exiting the mixing block 158 generally flow into a diffusion region 168 defined between the blocker plate 154 and the gas box 150. The pressure drop created as gases flow through the blocker plate 154 causes the process gases to flow radially outward from the mixing block 158 in the diffusion region 168. The gases then flow into a plenum 170 defined between the blocker plate 154 and the faceplate 156. The faceplate 156 is configured to distribute gases from the plenum 170 to the process volume 110 so that the material to be deposited by the process is uniformly deposited on the substrate 110 supported by the substrate support 112.

Figure 2:
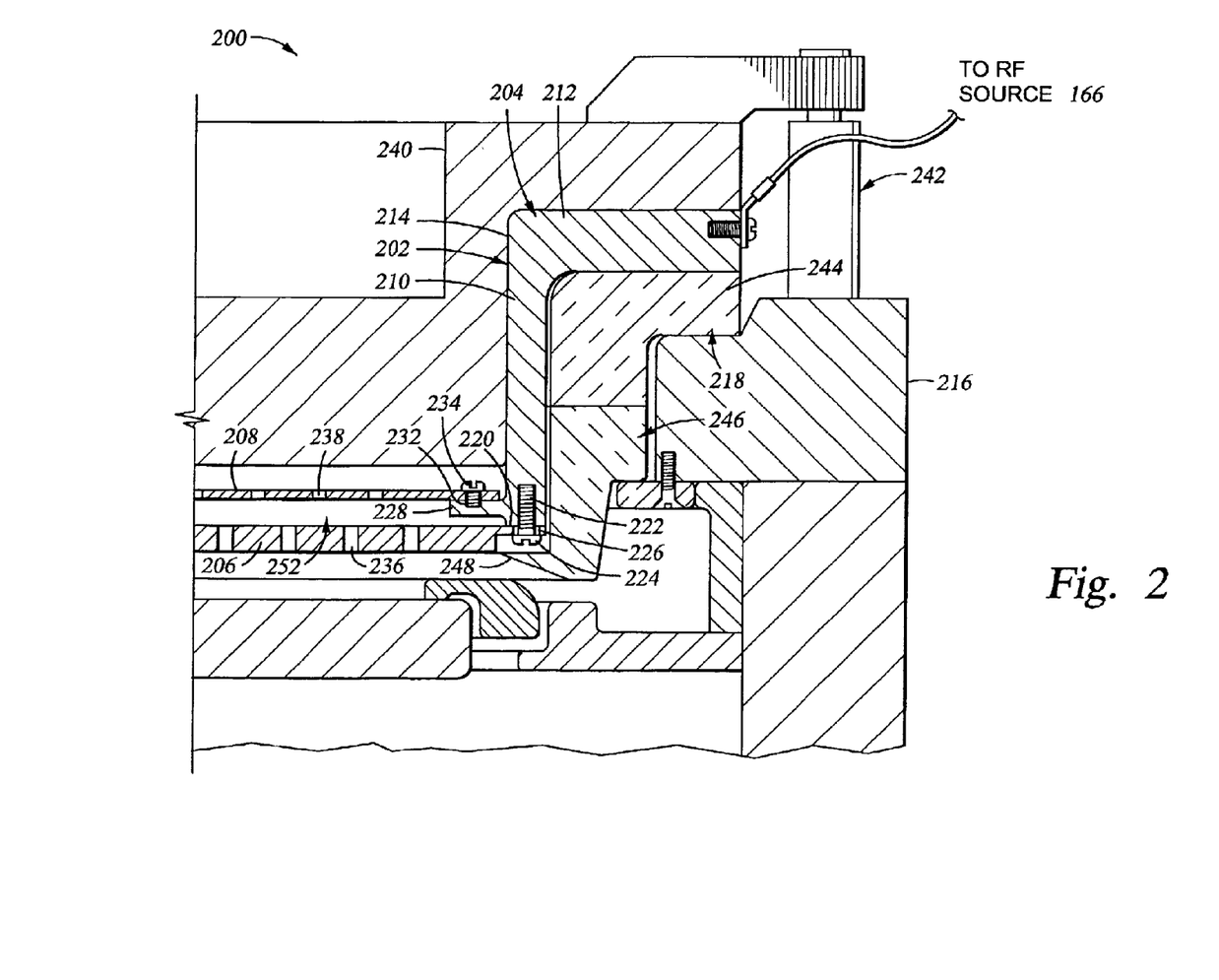
FIG. 2 is a partial sectional view of the lid assembly of FIG. 1.

FIG. 2 depicts a partial sectional view of a processing chamber 200 having one embodiment of a showerhead assembly 202. The showerhead assembly 202 generally includes a drum 204, a faceplate 206 and a blocker plate 208. The drum 204 is generally comprised of a conductive material, for example, graphite, nickel or other material compatible with process chemistries. Nickel, as termed throughout the specification and claims, is intended to include both nickel and nickel alloys. The drum 204 includes a cylindrical member 210 having a first flange 212 extending radially outward from a first end 214. The first flange 212 is disposed between a gas box 240 and a lid plate 216. A lip 244 of a top isolator 218 is typically comprised of ceramic and is disposed between the first flange 212 and the lid plate 216 to electrically isolate the drum 204 from the lid plate 216. A plurality of clamps 242 (one is shown in FIG. 2) are coupled to the lid plate 216 and generally urge the gas box 240 against the lid plate 216, thus sandwiching the first flange 212 of the drum 204 and the lip 244 of the top isolator 218 therebetween. The clamps 242 may be a cylinder, screw clamp or other fastening mechanism that allows the gas box 240 to be removably secured to the lid plate 216.

A second end 220 of the cylindrical member 210 is coupled to the faceplate 206. In one embodiment, the cylindrical member 210 is fastened to the faceplate 206 in a manner that allows relative movement therebetween that relieves stresses induced by thermal expansion and contraction of the faceplate 206 and cylindrical member 210. Preventing stress in the faceplate 206 of particular important where the faceplate 206 and cylindrical member 210 have different coefficients of thermal expansion which could result in warping or cracking of the faceplate 206 if rigidly secured to the cylindrical member 210 during temperature cycling.

In the embodiment depicted in FIG. 2, the second end 220 of the cylindrical member 210 includes a plurality of threaded holes 222 formed therein. Fasteners 224, passing through a clearance holes 226 formed in the faceplate 206, thread into the holes 222 in the cylindrical member 210. As the cylindrical member 210 expands moving the fasteners 224 radially outward, the clearance holes 226 are configured to allow some movement of the fasteners 224 laterally within the holes 226 so that the fasteners 224 do not induce stress upon the faceplate 206. The fasteners 224 typically are fabricated from nickel or other material compatible with process chemistries. The clearance holes 226 may be oversized circular holes, radially aligned slots or other geometry that allows movement of the fasteners 224 within the clearance hole 226.

The cylindrical member 210 additionally includes a second flange 228 extending radially inward between the first end 214 and the second end 220. The second flange 228 generally includes a plurality of mounting holes 232 to facilitate coupling the blocker plate 208 to the cylindrical member 210. The blocker plate 208 may be coupled to either side of the second flange 228 by fasteners 234 fabricated from nickel or other materials compatible with process chemistries.

The faceplate 206 generally has a disk-shape form and can be fabricated from nickel, graphite or other materials compatible with process chemistries. The faceplate 206 includes a plurality of apertures 236 formed therethrough that allow the passage of process and other gases through the faceplate 206. The apertures 236 are generally patterned to produce uniform distribution of gases flowing into the process chamber 200.

The blocker plate 208 generally has a disk-shape form and can be fabricated from nickel, graphite or other materials compatible with process chemistries. The blocker plate 208 includes a plurality of apertures 238 formed therethrough that allow the passage of process and other gases flowing from a gas box 240 through the blocker plate 208. The apertures 238 are generally patterned to radially distribute the gases flowing into a plenum 252 defined between the blocker plate 208 and faceplate 206 to enhance flow uniformity through the faceplate 206.

A lower isolator 246 is generally coupled to an interior side of the lid plate 216 and circumscribes a portion of the cylindrical member 210 of the drum 202 that extends into the chamber 200. The lower isolator 246 is typically comprised of ceramic and has an inwardly extending lip 248 that covers the interface of the faceplate 206 and the second end 220 of the cylindrical member 210 to prevent plasma from damaging the interface.

Figure 3:
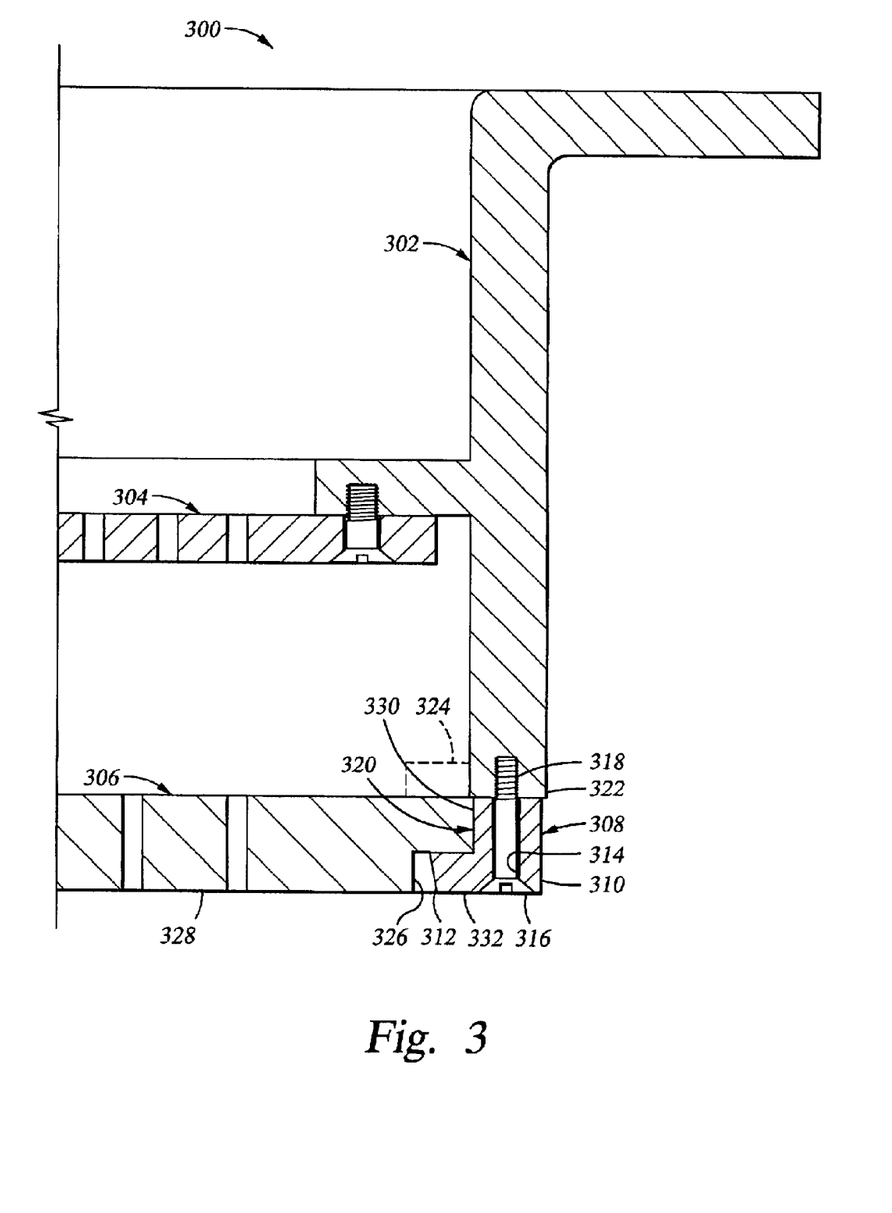
FIG. 3 is a sectional view of one embodiment of a showerhead assembly.

FIG. 3 is a sectional view of another embodiment of a showerhead assembly 300. The showerhead assembly 300 generally includes a drum 302, a blocker plate 304, a faceplate 306 and at least one clamp member 308. The clamp member 308 generally secures the faceplate 306 to the drum 302 without having fasteners pass through the faceplate 306, thereby eliminating the need for mounting holes or slots at the perimeter of the faceplate 306 and reducing fabrication costs of the faceplate 306. The drum 302, the blocker plate 304 and the faceplate 306 are generally substantially similar to the drum 204, the blocker plate 208 and the faceplate 206 described above.

The clamp member 308 generally includes a cylindrical body 310 and a tab 312 extending radially inward. The clamp member 308 is typically fabricated from graphite, nickel or other material compatible with process chemistries. A plurality of mounting holes 314 are formed through the cylindrical body 310. The mounting holes 314 accept a fastener 316 with secures the clamp member 308 to the drum 302 typically by mating with a threaded hole 318 formed in an end 322 of the drum 302.

The tab 312 generally overlaps a portion of the end 322 and forms a faceplate receiving pocket 320 between the tab 312, the cylindrical body 310 and the end 322 of the drum 302. The end 322 may include an optional flange 324 (shown in phantom) to provide a larger seating area for the faceplate 306. The faceplate 306 is disposed between the tab 312 and the end 322 of the drum 302 with the fasteners 316 typically disposed radially outwards of the faceplate 306 to eliminate the necessity to fabricated clearance holes or slots in the faceplate 306 thereby reducing faceplate fabrication costs.

In the embodiment depicted in FIG. 3, the faceplate 306 includes a recess 326 formed at the intersection of a first side 328 and an outer edge 330 of the faceplate 306. The recess 326 is configured to accept at least a portion of the tab 312, thereby positioning the faceplate 306 relative to the clamp member 308. Optionally, the recess 326 may be configured so that a surface 332 of clamp member 308 is disposed below or flush with the first side 328 of the faceplate 306.

Figure 4:
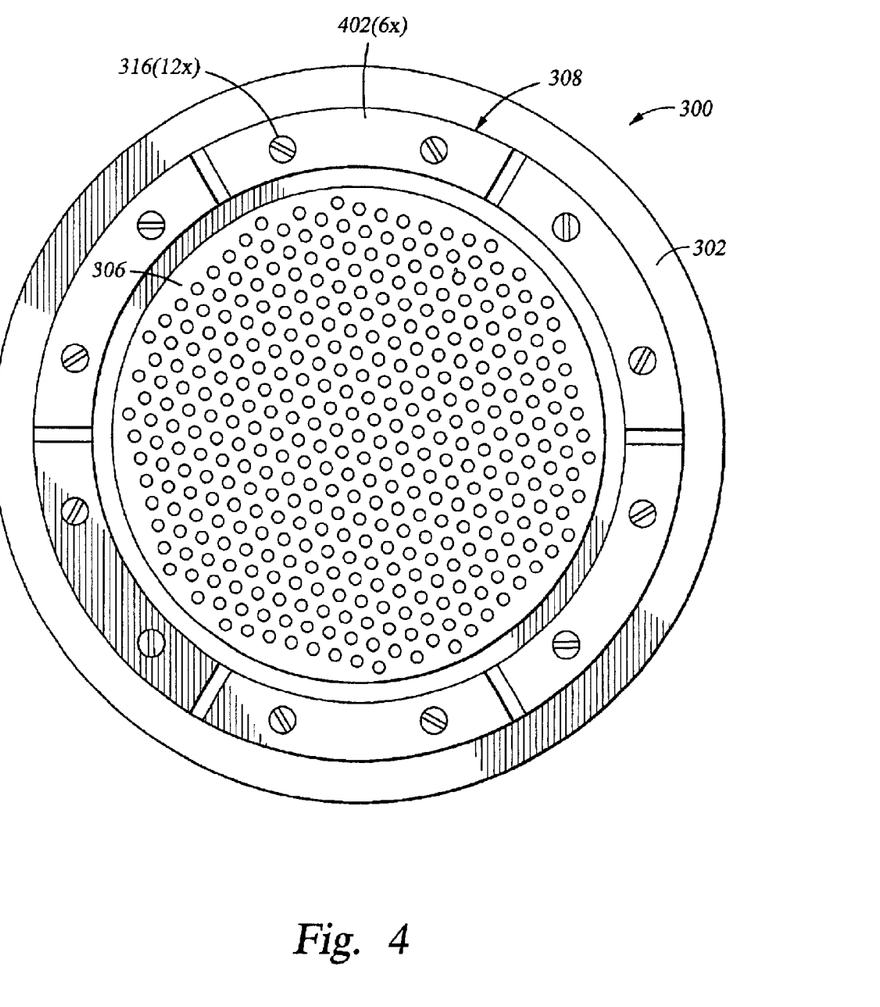
FIG. 4 is a bottom plan view of one embodiment of a showerhead assembly.

As the fasteners 316 are tightened, the tab 312 is urged towards the end 322 of the drum 302 and clamps the faceplate 306 to the drum 302. The torque of the fasteners 316 is set to securely fasten the faceplate 306 to the drum 302 while allowing movement therebetween when subjected to stresses induced by thermal expansion or contraction of the faceplate 306 and/or drum 302. Allowing movement to relieve thermally induced stress substantially eliminates cracking to extend faceplate life while reducing faceplate warping and enhancing flow uniformity. The clamp member 308 is typically fabricated as a ring or may be comprised of a plurality of segmented arc elements 402 as depicted in FIG. 4.

Figure 5:
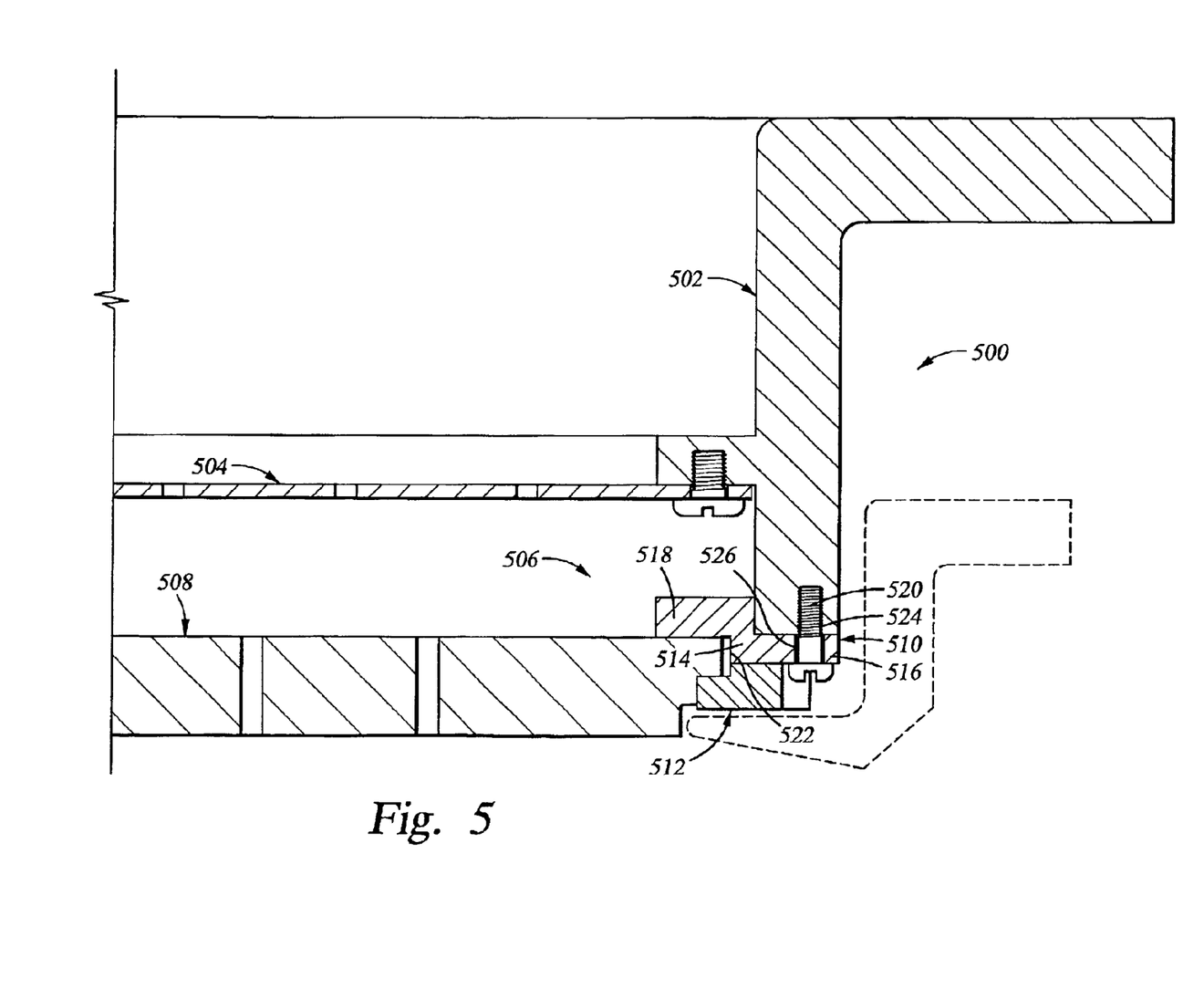
FIG. 5 is a sectional view of another embodiment of a showerhead assembly taken along section lines 5—5 of FIG. 7.
Figure 6:
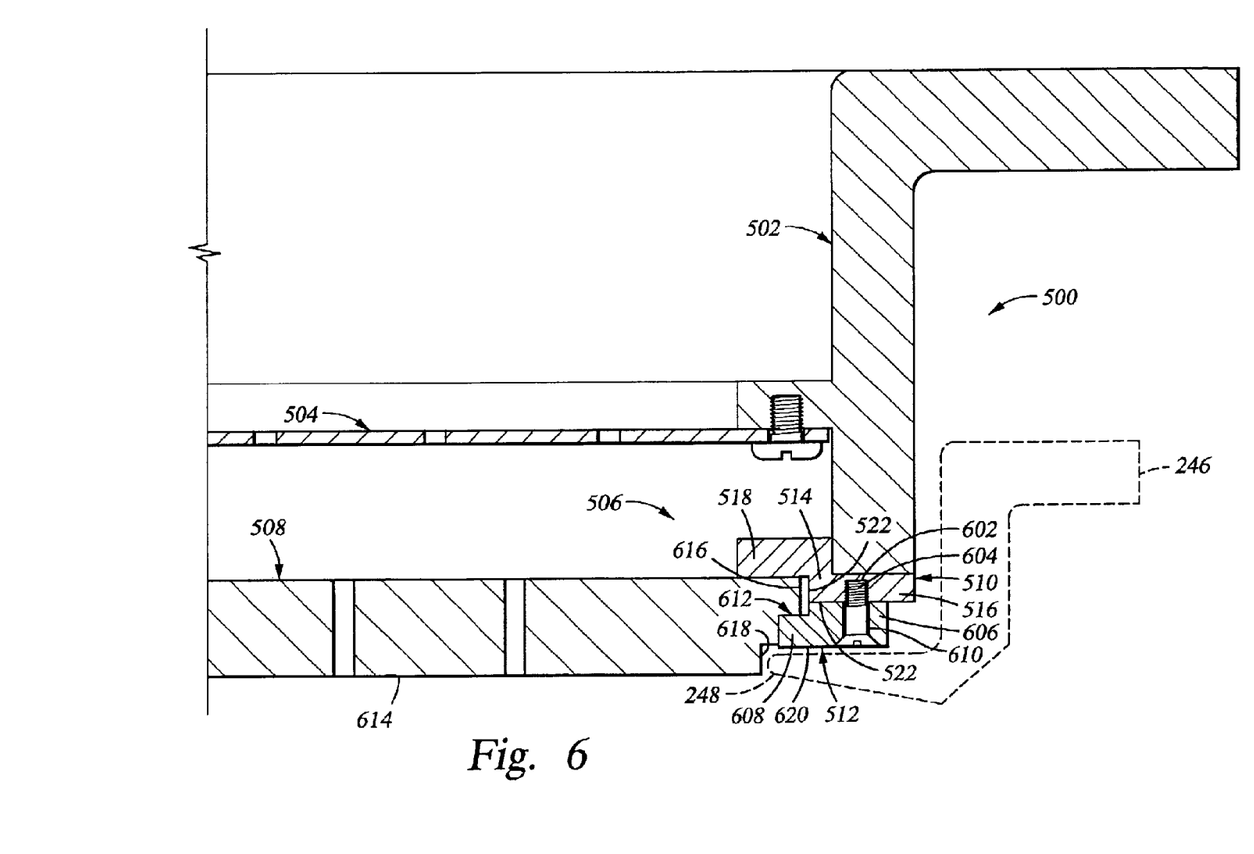
FIG. 6 is a sectional view of the showerhead assembly of FIG. 7 taken along section lines 6—6.
Figure 7:
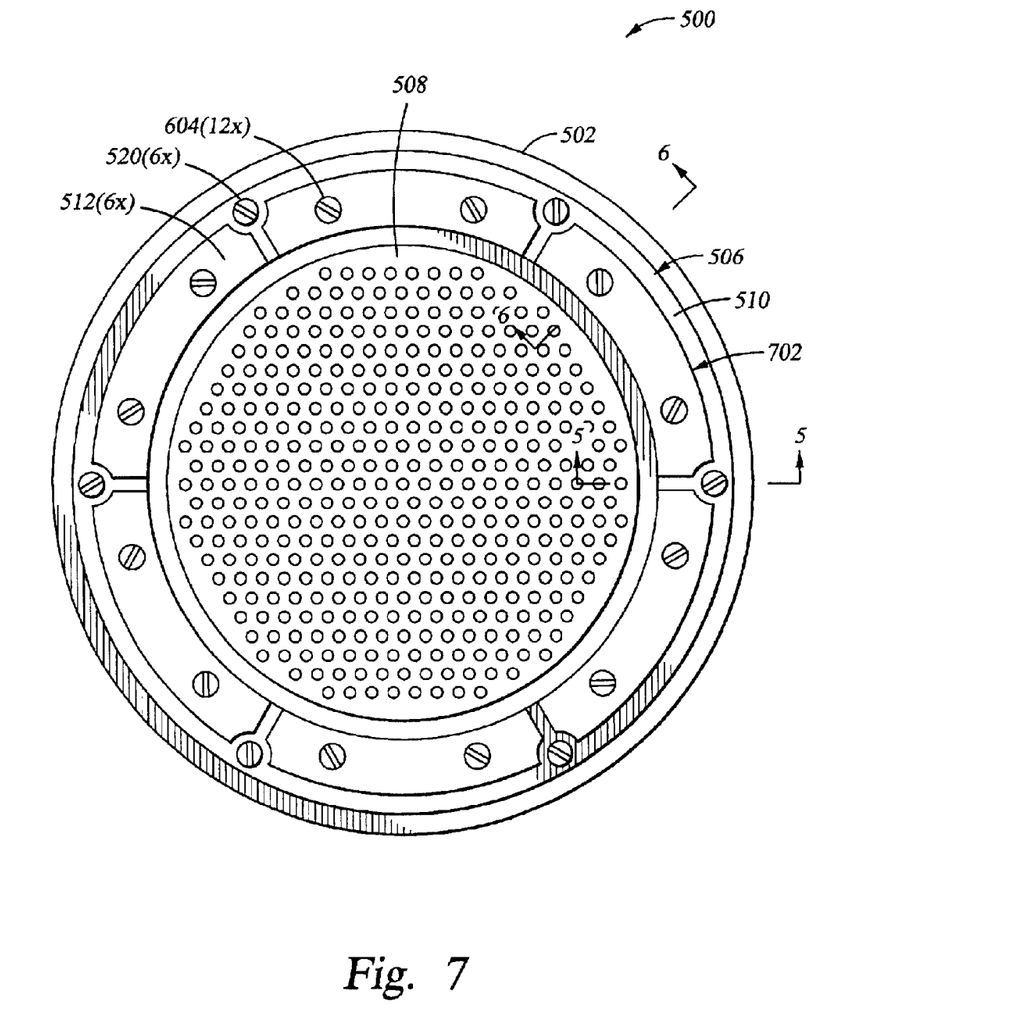
FIG. 7 is a bottom plan view of one embodiment of a showerhead assembly.

FIGS. 5–7 depict various views of another embodiment of a showerhead assembly 500. Referring to the sectional view of FIG. 5 along section line 5—5 of FIG. 7, the showerhead assembly 500 generally includes a drum 502, a blocker plate 504 and a faceplate assembly 506. The drum 502 and blocker plate 504 are substantially similar to the drums 204, 302 and blocker plates 208, 304 described above. The faceplate assembly 506 generally facilitates clamping of a faceplate 508 to the drum 504 while allowing the faceplate 508 to be removed from the drum 504 in a single unit, thereby minimizing potential damage and contamination to the chamber during servicing or replacing the faceplate 508.

The faceplate assembly 506 generally includes the faceplate 508, a mounting ring 510 and at least one clamp member 512. The clamp member 512 may be configured as a continuous ring or a plurality of clamp members 512 (as shown in FIG. 7). The mounting ring 510 is typically fabricated from graphite, nickel or other material compatible with process chemistries and includes an outer mounting portion 516 extending radially outward and an inner mounting portion 518 extending radially inward from a cylindrical body 514. The outer mounting portion 516 includes a plurality of mounting holes 526 that accepts a fastener 520 that mates with a threaded hole 524 in the drum 502, thereby securing the mounting ring 510 to the drum 502.

The inner mounting portion 518 is typically disposed on a plane different than a plane of the outer mounting portion 516 and provides a surface for the faceplate 508 to be clamped against. The inner mounting portion 518 and the cylindrical body 514 generally form a portion of a faceplate receiving pocket 522 that positions the faceplate 508 relative to the drum 502.

FIG. 6 is a sectional view of the showerhead assembly 500 taken along section line 6—6 of FIG. 7 and depicts the clamping of the faceplate 506 between the mounting ring 510 and the clamp member 512. The clamp member 512 generally includes a cylindrical body 606 having a tab 608 extending radially inward therefrom. The tab 608 is configured to extend to an inner diameter which is smaller than an outer diameter of the faceplate 508 thereby ensuring contact therewith during clamping. The cylindrical body 606 includes a plurality of through holes 610 that allow fasteners 604 utilized to secure the clamp member 512 to the mounting ring 510.

The fasteners 604 are typically comprised of nickel or other material compatible with process chemistries. The fasteners 604 pass through the holes 610 in the clamp member 512 and mate with a plurality of threaded holes 602 that are typically formed at least partially in one or both of the outer mounting portion 516 and the cylindrical body 514 of the mounting ring 510. As the fasteners 604 are tightened and urge the clamp member 512 towards the mounting ring 510, the clamp member 512 clamps the faceplate 508 securely against the inner mounting portion 518 of the mounting ring 510. The torque of the fasteners 602 is set to securely fasten the faceplate 508 between the mounting ring 510 while allowing movement therebetween when subjected to stresses induced by thermal expansion or contraction of the faceplate 508, clamp member 512 and/or mounting ring 510.

In the embodiment depicted in FIG. 6, the faceplate 508 includes a an annular recess 612 formed at the intersection of a first side 614 and an outer edge 616 of the faceplate 508 that accepts at least a portion of the tab 608 of the clamp member 512. The recess 612 may be configured to allow a surface 620 of the clamp member 512 to be flush with or recessed below the first side 614 of the faceplate 508.

The recess 612 may also be configured to accept the lip 248 of the lower insulator 246 (shown in phantom) to cover the interface of the faceplate 508 and the tab 608 of the clamp member 512. Optionally, the faceplate 508 may include a step 618 formed in the first side 614 of the faceplate 508 radially inward of the recess 612 to more completely shield the interface between the faceplate 508 and clamp member 512. The clamp member 512 may be fabricated as a continuous ring or may be comprised of a plurality of segmented arc elements 702 as depicted in FIG. 7.

While the foregoing is directed to the preferred embodiment of the present invention, other and further embodiments of the invention may be devised without departing from the basic scope thereof. The scope of the invention is determined by the claims that follow.

What is claimed is:

1. A showerhead assembly for distributing gases within a processing chamber, comprising:

a cylindrical member having an outwardly extending first flange at a first end;

a disk having a plurality of holes formed though a center region of the disk, the disk coupled to the cylindrical member at a second end in a manner that permits relative movement there between;

a mounting ring coupled to the second end of the cylindrical member; and at least one clamp member coupled to the mounting ring and sandwiching the disk therebetween.

2. The showerhead assembly of claim 1, wherein the cylindrical member further comprises:

a second flange extending inwardly between the first end and the second end; and a blocker plate having a plurality of holes formed therein and coupled to the second flange.

3. The showerhead assembly of claim 1, wherein the disk has a coefficient of thermal expansion different from a coefficient of thermal expansion of the cylindrical member.

4. The showerhead assembly of claim 2, wherein the blocker plate is nickel or graphite.

5. The showerhead assembly of claim 1, wherein the cylindrical member further comprises:

a plurality of threaded holes formed in the second end.

6. The showerhead assembly of claim 1, wherein the clamp member further comprises:

an at least partially cylindrical body; and a tab extending radially inward from the body.

7. The showerhead assembly of claim 6, wherein the disk further comprises:

an annular recess formed at the intersection of a first side and an outer edge of the disk and accepting at least a portion of the tab.

8. The showerhead assembly of claim 7, wherein the mounting ring further comprises:
a cylindrical body having a first plurality of holes formed therethrough and a second plurality of holes formed therein, the second plurality of holes adapted to accept a fastener for coupling the clamp member to the mounting ring; and
a lip extending radially inward from the cylindrical body.

9. The showerhead assembly of claim 8, wherein the disk is sandwiched between the lip and the tab, and a plurality of fasteners are disposed through the clamp member into the mounting ring radially outward of the disk.

10. The showerhead assembly of claim 6, wherein a surface of the clamp member opposite the mounting ring is recessed below a first side of the disk.

11. The showerhead assembly of claim 6, wherein the clamp member comprises a plurality of segmented arcs.

12. The showerhead assembly of claim 1, wherein at least one of the cylindrical member, clamp member, and the mounting ring is nickel.

13. The showerhead assembly of claim 1, wherein the disk is nickel or graphite.

14. The showerhead assembly of claim 1, wherein the disk is graphite.

15. A showerhead assembly for distributing gases within a processing chamber comprising:
a cylindrical member having an outwardly extending flange at a first end;
a disk having a plurality of holes formed though a center region of the disk;
at least one clamp member slidably retaining the disk proximate a second end of the cylindrical member; and
a mounting ring coupled to the second end of the cylindrical member, the clamp member fastened to the cylindrical member and sandwiching the disk therebetween.

16. The showerhead assembly of claim 15, wherein the clamp member is fastened to the mounting ring radially outward of the disk.

17. The showerhead assembly of claim 15, wherein the clamp member is comprised of a plurality of segmented arcs.

18. A showerhead assembly for distributing gases within a processing chamber, comprising:
an annular mounting ring having a first plurality of holes formed therethrough proximate an outer diameter and a second plurality of holes formed therein;
a disk having an outer edge, a first side and a second side;
a plurality of holes formed though a center portion of the disk;
a recess formed at an intersection of the outer edge and the first side of the disk;
a least one clamp body having at least one clearance hole formed therethrough and adapted to accept a fastener that threads into one of the second plurality of holes formed in the annular mounting ring; and
a tab extending from the clamp body at least partially into the recess of the disk and adapted to urge the second side of the disk against the annular mounting ring.

19. The showerhead assembly of claim 18, wherein the disk is nickel or graphite.

20. A processing chamber comprising:
a chamber body having walls and a bottom defining a processing region;
a substrate support disposed in the processing region of the chamber body;
a gas box supported by the walls and having a fluid channel disposed therethrough;
a cylindrical member having an outwardly extending first flange at a first end disposed between the gas box and the walls of the chamber body, and a second end extending into the processing region;
an annular mounting ring coupled to the cylindrical member, the annular mounting ring having a plurality of holes formed therein;
a disk having an outer edge, a first side and a second side;
a plurality of holes formed though a center portion of the disk;
a recess formed at an intersection of the outer edge and the first side of the disk;
a least one clamp body having at least one clearance hole formed therethrough and adapted to accept a fastener that threads into one of the plurality of holes formed in the annular mounting ring; and
a tab extending from the clamp body at least partially into the recess of the disk and adapted to urge the second side of the disk against the annular mounting ring.

* * * * *